(12) United States Patent
Schneider

(10) Patent No.: US 6,238,778 B1
(45) Date of Patent: May 29, 2001

(54) COMPONENT OF PRINTED CIRCUIT BOARDS

(75) Inventor: Bernd Schneider, March-Holzhausen (DE)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/269,316

(22) PCT Filed: Nov. 4, 1998

(86) PCT No.: PCT/US98/23545

§ 371 Date: Mar. 24, 1999

§ 102(e) Date: Mar. 24, 1999

(87) PCT Pub. No.: WO00/25961

PCT Pub. Date: May 11, 2000

(51) Int. Cl.[7] .................................................. B32B 9/00
(52) U.S. Cl. ........................ 428/209; 428/626; 428/901
(58) Field of Search ..................................... 428/624, 607, 428/935, 938, 626, 677, 679, 901, 209, 195

(56) References Cited

U.S. PATENT DOCUMENTS

| | | |
|---|---|---|
| 3,555,169 | 1/1971 | Miller . |
| 3,595,632 | 7/1971 | Ross . |
| 3,655,349 | 4/1972 | Shah et al. . |
| 3,958,317 | 5/1976 | Peart et al. . |
| 3,981,691 | 9/1976 | Cuneo . |
| 4,010,005 | 3/1977 | Morisaki et al. . |
| 4,563,399 | 1/1986 | Wright, Jr. . |
| 4,770,947 | 9/1988 | Flagello et al. . |
| 4,863,808 | 9/1989 | Sallo . |
| 5,153,050 | 10/1992 | Johnston ............................ 428/209 |
| 5,320,919 | 6/1994 | Azuma et al. . |
| 5,496,422 | 3/1996 | Morishige et al. . |
| 5,512,381 | 4/1996 | Konicek et al. .................. 428/607 |
| 5,674,596 | 10/1997 | Johnston . |
| 5,686,194 | 11/1997 | Shimizu et al. . |
| 5,942,315 | 8/1999 | Johnston ............................ 428/209 |
| 6,127,051 | 10/2000 | Frater ................................ 428/677 |
| 6,129,998 | 10/2000 | Frater ................................ 428/677 |

*Primary Examiner*—Francis J. Lorin
(74) *Attorney, Agent, or Firm*—Mark Kusner; Michael A. Centanni

(57) ABSTRACT

A component for use in manufacturing articles, such as printed circuit boards, comprising a laminate constructed of a sheet of copper foil that, in a finished circuit board, constitutes a functional element, and a sheet of carbon steel having a layer of an inert metal thereon, the sheet of carbon steel constituting a discardable element. One surface of the copper sheet and the surface of the inert metal layer on the carbon steel sheet are essentially uncontaminated and engageable with each other at interfaces. The copper sheet is attached to the inert metal layer of the carbon steel sheet at their borders and defines substantially uncontaminated central zones inwardly of the edges of the sheets that are unjoined at the interfaces.

10 Claims, 1 Drawing Sheet

COMPONENT OF PRINTED CIRCUIT BOARDS

FIELD OF THE INVENTION

The present invention relates generally to printed circuits, and more particularly, to components used in the manufacturing of printed circuit boards and other articles.

BACKGROUND OF THE INVENTION

In the manufacture of printed circuit boards, sheets of copper foil are typically bonded to a dielectric layer of a partially cured epoxy resin containing woven glass fiber (such a dielectric layer is conventionally referred to as a "pre-preg"). In the manufacture of copper clad laminates, sheets of copper foil are typically bonded to another layer of foil. In both processes, the copper foil is etched to produce conductive paths. In such processes, it is extremely important to avoid contamination of the copper foil sheets in that any foreign matter contacting the copper foil, such as resin dust, fiberglass fibers, hair, grease, oil or the like, may result in dots, dents, deposits or pits on the copper foil that can adversely affect the formation of the conductive paths forming the printed circuits.

Copper foil is conventionally formed by an electrodeposition process. Following the production of the copper foil, it is known to secure a metallic substrate to one side of the copper foil to protect that side of the copper foil from contamination during subsequent handling and shipping. The protected side of the copper foil is typically the side used to form the conductive pathways, while the exposed side of the foil is typically the side that is attached to a pre-preg or bonded to another layer of copper foil. The protective metallic substrate remains attached to the copper foil as it is attached to the pre-preg or bonded to the other layer of copper foil. The protective metallic substrate is subsequently removed and discarded (or recycled) to expose the protected, uncontaminated side of the foil for processing to form the conductive pathways.

U.S. Pat. No. 5,153,050 to Johnston discloses a copper/aluminum/copper laminate wherein the shiny side of a copper foil is bonded along its peripheral edges to an aluminum substrate. U.S. Pat. No. 5,674,596 to Johnston further discloses securing copper foil to a metallic substrate, such as a steel or a stainless steel substrate. U.S. Pat. No. 5,512,381 to Konicek et al. discloses securing copper foil to a copper substrate.

Each of the foregoing structures uses a relatively expensive material, e.g., aluminum, stainless steel and copper, to form the disposable, protective substrate. In addition to the cost of such materials, copper and aluminum are relatively soft metals that are susceptible to image transfer during lamination of multi-layer laminates, particularly at high lamination temperatures and pressures. Stainless steel is a stronger metal than copper or aluminum, and possesses the corrosion resistance necessary to avoid contamination of the copper foil sheet. As a result, stainless steel finds advantageous application at higher laminating temperatures and pressures. However, corrosion resistance and higher strength of stainless steel come at a price. Typically, stainless steel sheet is even more expensive than copper and aluminum sheet.

The present invention provides a component for manufacturing printed circuit boards that has a copper foil protected by a metallic substrate, wherein the metallic substrate has the corrosion resistance of stainless steel at a significantly reduced cost.

SUMMARY OF THE INVENTION

In accordance with the present invention, there is provided a component for use in manufacturing articles such as printed circuit boards. The component is comprised of a laminate constructed of a sheet of copper foil that, in a finished printed circuit board, constitutes a functional element, and a sheet of carbon steel having a layer of an inert metal thereon. The sheet of carbon steel constitutes a discardable element. One surface of the copper sheet and the surface of the inert metal layer on the carbon steel sheet are essentially uncontaminated and are engageable with each other at interfaces. The copper sheet is attached to the inert metal layer of the carbon steel sheet at its borders to define substantially uncontaminated central zones inwardly of the edges.

In accordance with another aspect of the present invention, there is provided a sheet of copper foil for manufacturing multi-layer laminates comprising a sheet of copper foil having a thickness greater than about 5 microns. The copper foil has a first surface adapted for adhering to a fiber reinforced polymer layer, and a second surface to be exposed after the first surface is adhered to the fiber reinforced polymer layer. A protective sheet of carbon steel having a thickness of about 0.05 mm to about 2.0 mm is provided. The carbon steel sheet has a layer of chromium with about 0.1 grams/m$^2$ to about 10 grams/m$^2$ electrodeposited on its surface. The layer of chromium engages the second surface of the copper sheet and is attached thereto in a manner defining substantially uncontaminated central zones.

It is an object of the present invention to provide a component having a copper sheet for use in manufacturing articles, such as printed circuit boards, and a metallic substrate to protect a surface of the copper sheet before and during a manufacturing process.

It is a further object of the present invention to provide a component as described above wherein the metallic substrate is a relatively low cost, discardable item.

It is a further object of the present invention to provide a component as described above wherein the metallic substrate is formed of carbon steel and has an outer layer of an inert metal thereon for engagement with the copper sheet.

It is a further object of the present invention to provide a component as described above wherein the inert metal is chromium.

It is another object of the present invention to provide a component as described above that is suitable for high temperature processing applications.

A still further object of the present invention is to provide a component as described above wherein the discardable metallic substrate has a coefficient of thermal expansion approximately equal to the coefficient of thermal expansion of press plates used in forming laminated circuit boards.

A still further object of the present invention is to provide a component as described above wherein the metallic substrate is dimensioned and used as a press plate in a circuit board forming operation.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF THE PREFERRED EMBODIMENT

Figure 2:
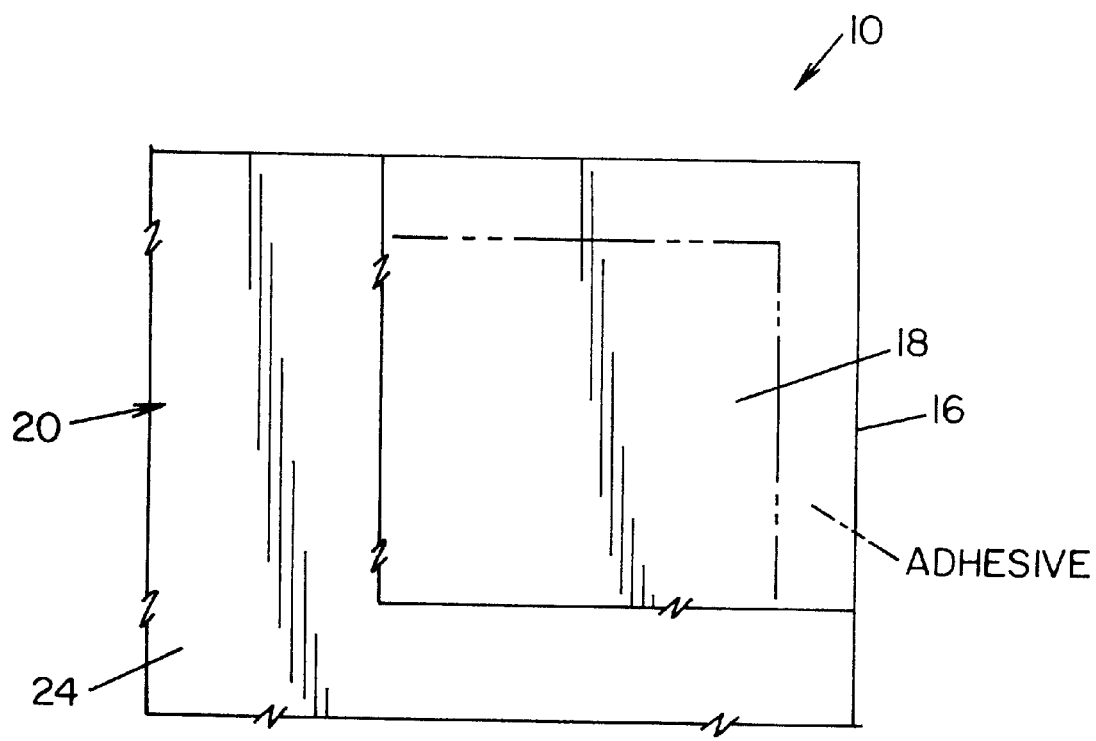
FIG. 2 is a partially sectioned, top plan view of a portion of the component shown in FIG. 1.
Figure 1:
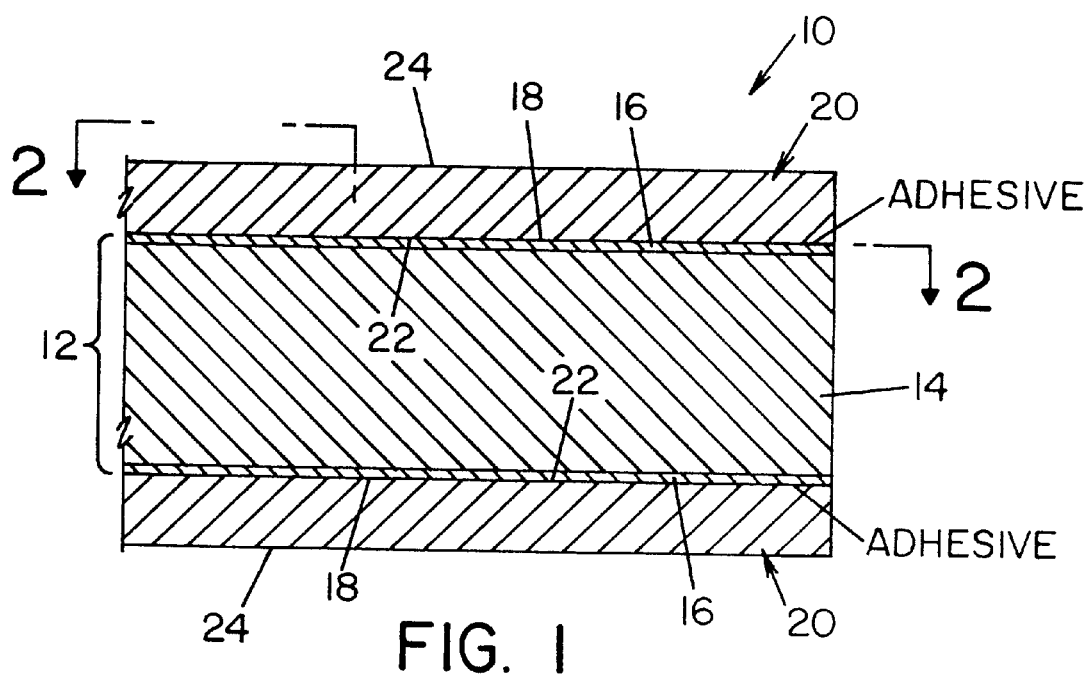
FIG. 1 is an enlarged sectional view of a component used in forming articles such as printed circuit boards, illustrating a preferred embodiment of the present invention.

Referring now to the drawings wherein the showing is to illustrate a preferred embodiment of the invention only, and not for the purpose of limiting same, FIG. 1 shows a component 10 for use in manufacturing articles such as printed circuit boards, illustrating a preferred embodiment of the present invention. In the embodiment shown, component 10 is comprised of a metallic substrate, designated 12, having copper sheets, designated 20, attached thereto. Substrate 12 is comprised of a metallic sheet 14 having thin layers 16 of an inert metal formed on the surfaces thereof.

In accordance with a preferred embodiment of the present invention, metallic sheet 14 is comprised of conventional, mild carbon steel. Carbon steel sheet 14 preferably has a thickness of from about 0.05 mm to about 2.0 mm, and more preferably, has a thickness of from about 0.1 mm to about 0.3 mm. Layers 16 of inert metal on sheet 14 are preferably selected from the group consisting of nickel, copper, cobalt, brass, chromium, antimony, cadmium and combinations thereof. In a preferred embodiment of the present invention, layer 16 is comprised of essentially pure chromium. Chromium layer 16 preferably has a thickness of from about 0.1 gram/m$^2$ to about 10 grams/m$^2$, and more preferably, has a thickness of from about 2.0 grams/m$^2$ to about 4.0 grams/m$^2$. Chromium layer 16 may be deposited through a number of various conventionally known techniques, such as wet chemical deposition, autocatalytic deposition, chemical vapor deposition, e.g., evaporation or sputtering, ion bombardment or electrolytic deposition. In a preferred embodiment of the present invention, chromium layer 16 is electrolytically deposited on carbon steel sheet 14. In a preferred embodiment, carbon steel sheet 14 has a Rockwell 30-T hardness of between about 40 and about 60, a tensile strength of between about 390 newtons/mm$^2$ and about 440 newtons/mm$^2$, a thickness of about 0.18 mm, and chromium layer 16 is about 2 grams/m$^2$.

In accordance with the present invention, carbon steel sheet 14, with the chromium layers 16 thereon, has a width approximately equal to the width of copper sheets 20 to be attached thereto. Surface 22 of copper sheet 20 that is ultimately to be exposed and etched into a printed circuit is placed facing surface 18 of chromium layer 16 of carbon steel sheet 14. Surface 18 of chromium layer 16 is cleaned so as to be substantially contamination-free. Copper foil sheets 20 are attached to chromium layer 16 of substrate 12 such that interior portions of the facing surfaces of sheets 20 are substantially uncontaminated in a region 30 inwardly from edge portions 32 of sheets 20. More specifically, copper sheets 20 are preferably attached to substrate 12 in the vicinity of edge portions 32 by an adhesive or an adhesive-like material (not shown). Such materials may include adhesives, resins or tapes. Copper sheets 20 may also be adhered by mechanical means, such as crimping, deforming and the like. In a preferred embodiment of the present invention, beads of a flexible adhesive (not shown), conventionally known in the art, are applied in edge portions 32 of copper sheets 20 and substrate 12 to secure the same to each other.

The present invention thus provides a component 10 for forming circuit boards or other articles that includes a copper sheet 20 adapted to be attached to a polymer board. Surface 22 of copper sheet 20 that is to be ultimately exposed and etched by a forming process is protected by a relatively inexpensive metallic substrate 12 having a thin layer 16 of an inert metal on an inner core 14 of carbon steel. The inert metal protects surface 22 of copper 20 from corrosion conventionally associated with ordinary carbon steel. At the same time, the carbon steel core 14 of metallic substrate 12 provides the strength of steel, at significantly less cost than using stainless steel sheet. Importantly, the carbon steel core 14 has essentially the same coefficient of thermal expansion as the press plates that conventional, multi-opening presses use in forming printed circuit boards. Thus, the laminated structure to be formed with copper sheet 20 is disposed between two materials having the same or similar coefficients of thermal expansion, i.e., the press plate and substrate 12. This provides a more uniform distribution of stresses in the laminate during the heating and compression steps of processing. In addition, the use of chromium as a protection layer on the steel allows for higher processing temperatures when using polymer materials requiring higher setting temperatures.

The foregoing description discloses preferred embodiments of the present invention. It should be appreciated that the embodiments are described for the purpose of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A component for use in manufacturing articles, such as printed circuit boards, comprising: a laminate constructed of a sheet of copper foil that, in a finished printed circuit board, constitutes a functional element and a sheet of carbon steel having a thin layer of chromium metal thereon, said sheet of carbon steel constituting a discardable element, one surface of the copper sheet and the surface of said chromium metal layer on the carbon steel sheet being essentially uncontaminated and engageable with each other at interfaces, said copper sheet being attached to said chromium metal layer of the carbon steel sheet at its borders and defining a substantially uncontaminated central zones inwardly of the edges of the sheets and unjoined at the interfaces.

2. A component as defined in claim 1, wherein said chromium layer has a thickness of about 0.1 gram/m$^2$ to about 10 grams/m$^2$.

3. A component as defined in claim 2, wherein said chromium layer has a thickness of about 2.0 grams/m$^2$ to about 4 grams/m$^2$.

4. A component as defined in claim 2, wherein said chromium is electrolytically deposited on said carbon steel sheet.

5. A component as defined in claim 2, wherein said chromium is vapor deposited of said carbon steel sheet.

6. A component as defined in claim 1, wherein said carbon steel sheet has a thickness of about 0.05 mm to about 2.0 mm.

7. A component as defined in claim 2, wherein said carbon steel sheet has a thickness of about 0.1 mm to about 0.3 mm.

8. A component as defined in claim 1, wherein said copper sheet is attached to said chromium metal layer by an adhesive along edges of said copper sheet and metal layer of said carbon steel sheet.

9. A protected sheet of copper foil for manufacturing multi-layer laminate, comprising:

(a) a sheet of copper foil having a thickness greater than about 5 $\mu$m and having a first surface adapted for adhering to fiber reinforced polymer layer and a second surface to be exposed after said first surface is adhered to said fiber reinforced polymer layer;

(b) a protective sheet of carbon steel having a thickness of about 0.05 mm to about 2.0 mm, said carbon steel sheet having a layer of chromium of about 0.1 gram/m$^2$ to about 10 grams/m$^2$ electrodeposited thereon, said layer of chromium covering said second surface of said copper sheet and being attached thereto in a manner defining substantially uncontaminated central zones.

10. A sheet as defined in claim 9, wherein said copper sheet is attached to said carbon steel sheet along said layer of chromium by adhesive along edges of said sheets.

\* \* \* \* \*

(12) EX PARTE REEXAMINATION CERTIFICATE (5573rd)
United States Patent
Schneider

(10) Number: US 6,238,778 C1
(45) Certificate Issued: Oct. 17, 2006

(54) COMPONENT OF PRINTED CIRCUIT BOARDS

(75) Inventor: Bernd Schneider, March-Holzhausen (DE)

(73) Assignee: Gould Electronics Inc., Fastlake, OH (US)

Reexamination Request:
No. 90/007,061, Jun. 2, 2004

Reexamination Certificate for:
Patent No.: 6,238,778
Issued: May 29, 2001
Appl. No.: 09/269,316
Filed: Mar. 24, 1999

(22) PCT Filed: Nov. 4, 1998

(86) PCT No.: PCT/US98/23545

§ 371 (c)(1),
(2), (4) Date: Mar. 24, 1999

(87) PCT Pub. No.: WO00/25961

PCT Pub. Date: May 11, 2000

(51) Int. Cl.
*B32B 9/00* (2006.01)

(52) U.S. Cl. .................. 428/209; 428/626; 428/901
(58) Field of Classification Search ............... 428/677, 428/607, 612, 606, 626, 935, 938, 679, 209, 428/681, 684, 666, 667; 174/255, 256
See application file for complete search history.

(56) References Cited

U.S. PATENT DOCUMENTS

| | | | |
|---|---|---|---|
| 3,323,881 A | 6/1967 | Nelson et al. | |
| 3,998,601 A | 12/1976 | Yates et al. | |
| 4,568,413 A | 2/1986 | Toth et al. | |
| 4,715,116 A | 12/1987 | Thorpe et al. | ................. 29/846 |
| 4,781,991 A | 11/1988 | Thorpe et al. | |
| 4,999,259 A | 3/1991 | Hashimoto et al. | ......... 428/685 |
| 5,153,050 A | 10/1992 | Johnston | |
| 5,512,381 A | 4/1996 | Konicek et al. | |
| 5,617,629 A | 4/1997 | Ekstrom | |
| 5,674,596 A | 10/1997 | Johnston | ..................... 428/209 |
| 5,725,937 A | 3/1998 | Johnston | |
| 5,942,314 A | 8/1999 | Fisher et al. | ................. 428/198 |
| 6,127,051 A | 10/2000 | Frater | |

FOREIGN PATENT DOCUMENTS

| | | |
|---|---|---|
| DE | 24829 | 2/1987 |
| JP | 03-150159 | 6/1991 |
| JP | 4304396 | 10/1992 |
| JP | 07-232341 | 9/1995 |
| WO | WO 9304571 | 4/1993 |
| WO | WO 99/53737 | 10/1999 |

OTHER PUBLICATIONS

V. Neufeldt, ed., Webster's New World Dictionary, Simon & Schuster, New York, 1988 (no month), p. 250.*

* cited by examiner

*Primary Examiner*—Michael E. Lavilla

(57) ABSTRACT

A component for use in manufacturing articles, such as printed circuit boards, comprising a laminate constructed of a sheet of copper foil that, in a finished circuit board, constitutes a functional element, and a sheet of carbon steel having a layer of an inert metal thereon, the sheet of carbon steel constituting a discardable element. One surface of the copper sheet and the surface of the inert metal layer on the carbon steel sheet are essentially uncontaminated and engageable with each other at interfaces. The copper sheet is attached to the inert metal layer of the carbon steel sheet at their borders and defines substantially uncontaminated central zones inwardly of the edges of the sheets that are unjoined at the interfaces.

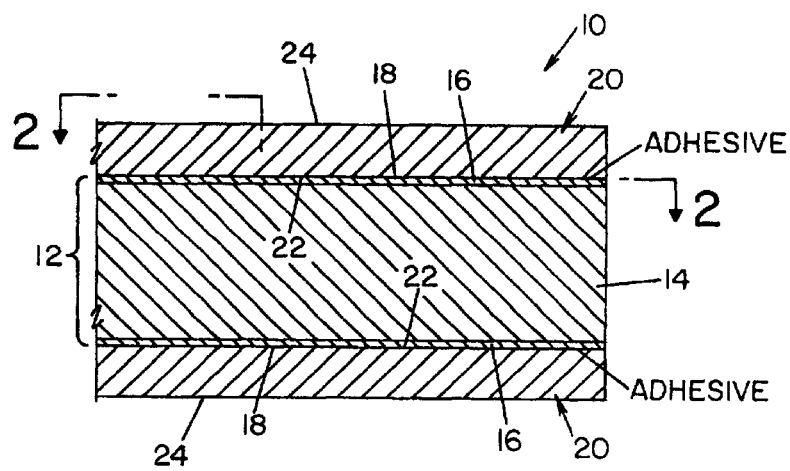

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–10 are cancelled.

* * * * *